(12) United States Patent
Chen et al.

(10) Patent No.: US 7,646,641 B2
(45) Date of Patent: Jan. 12, 2010

(54) NAND FLASH MEMORY WITH NITRIDE CHARGE STORAGE GATES AND FABRICATION PROCESS

(75) Inventors: Chiou-Feng Chen, Santa Clara, CA (US); Der-Tsyr Fan, Hsinchu (TW); Prateep Tuntasood, Santa Clara, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 942 days.

(21) Appl. No.: 10/869,475

(22) Filed: Jun. 15, 2004

(65) Prior Publication Data
US 2005/0276106 A1    Dec. 15, 2005

(51) Int. Cl.
*G11C 16/04* (2006.01)
(52) U.S. Cl. .................. 365/185.17; 365/185.18; 257/324
(58) Field of Classification Search ............. 365/185.1, 365/185.17 O, 185.18 X, 185.27, 185.28, 365/185.29, 185.17, 185.18; 257/324 X, 257/438, 324; 438/315
See application file for complete search history.

(56) References Cited

U.S. PATENT DOCUMENTS

| | | | |
|---|---|---|---|
| 4,959,812 A | | 9/1990 | Momodomi et al. |
| 5,050,125 A | | 9/1991 | Momodomi et al. |
| 6,486,028 B1 | * | 11/2002 | Chang et al. ................ 438/259 |
| 6,531,732 B2 | * | 3/2003 | Sugita et al. ................ 257/315 |
| 6,885,586 B2 | * | 4/2005 | Chen et al. ............ 365/185.17 |
| 6,992,929 B2 | * | 1/2006 | Chen et al. ............ 365/185.17 |
| 7,006,378 B1 | * | 2/2006 | Saito et al. ............ 365/185.05 |
| 7,038,267 B2 | * | 5/2006 | Chang et al. ................ 257/315 |
| 2005/0087892 A1 | * | 4/2005 | Hsu et al. ................... 257/909 |

* cited by examiner

*Primary Examiner*—VanThu Nguyen
(74) *Attorney, Agent, or Firm*—Edward S. Wright

(57) ABSTRACT

NAND flash memory cell array having control gates and charge storage gates stacked in pairs arranged in rows between a bit line diffusion and a common source diffusion, with select gates on both sides of each of the pairs of stacked gates. The gates in each stacked pair are self-aligned with each other, and the charge storage gates are either a nitride or a combination of nitride and oxide. Programming is done by hot electron injection from silicon substrate to the charge storage gates to build up a negative charge in the charge storage gates. Erasing is done by channel tunneling from the charge storage gates to the silicon substrate or by hot hole injection from the silicon substrate to the charge storage gates. The array is biased so that all of the memory cells can be erased simultaneously, while programming is bit selectable.

15 Claims, 12 Drawing Sheets

NAND FLASH MEMORY WITH NITRIDE CHARGE STORAGE GATES AND FABRICATION PROCESS

BACKGROUND OF THE INVENTION

1. Field of Invention

This invention pertains generally to semiconductor memory devices and, more particularly, to a NAND flash memory and fabrication process.

2. Related Art

Nonvolatile memory is currently available in several forms, including electrically programmable read only memory (EPROM), electrically erasable programmable read only memory (EEPROM), and flash EEPROM. Flash memory has been widely used for high volume data storage in devices such as memory cards, personal digital assistants (PDA's), cellular phones, and MP3 players. Such applications require high density memory, with smaller cell size and reduced cost of manufacture.

The traditional NOR-type stack-gate flash memory cell usually has a bit line contact, a source region, a floating gate, and a control gate, with the control gate being positioned directly above the floating gate. Its relatively large cell size prevents it from being used in very high density data storage applications.

Cell size is smaller in a NAND flash memory array having a series of stack-gate flash memory cells connected in series between a bit-line and a source line, with only one bit-line contact, as illustrated in FIG. 1 and described in greater detail in U.S. Pat. Nos. 4,959,812 and 5,050,125. In this array, a plurality of stack-gate memory cells 21 are connected in series between a bit line 22 and a source line 23. The cells are formed in a P-well 24 in a substrate 26 of either N- or P-type silicon. Each of the cells has a floating gate 27 fabricated of a conductive material such as polysilicon and a control gate 28 fabricated of a conductive material such as polysilicon or polycide. The control gate is above and in vertical alignment with the floating gate.

Two select gates 29, 31 are included in the array, one near the bit line contact 32 and one near source diffusion 23. Diffusions 33 are formed in the substrate between the stacked gates and between the stacked gates and the select gates to serve as source and drain regions for the transistors in the memory cells. The bit line diffusion, source diffusion, and the diffusions 33 are doped with N-type dopants.

To erase the memory cell, a positive voltage of about 20 volts is applied between the P-well and the control gates, which causes the electrons to tunnel from the floating gates to the channel regions beneath them. The floating gates thus become positively charged, and the threshold voltage of the stack-gate cells becomes negative.

To program the memory cells, the control gates are biased to a level of about 20 volts positive relative to the P-well. As electrons tunnel from the channel region to the floating gates, the floating gates are negatively charged; and the threshold voltage of the stack-gate cells becomes positive. By changing the threshold voltage of a stack-gate cell, the channel beneath it can be in either a non-conduction state (logic "0") or a conduction state (logic "1") when a zero voltage is applied to the control gate during a read operation.

However, as the fabrication process advances to very small geometries, e.g., tens of nanometer, it is difficult to form a high-voltage coupling ratio which is sufficient for program and erase operations while maintaining a small cell size.

OBJECTS AND SUMMARY OF THE INVENTION

It is in general an object of the invention to provide a new and improved semiconductor device and process of fabricating the same.

Another object of the invention is to provide a semiconductor device and process of the above character which overcome the limitations and disadvantages of the prior art.

These and other objects are achieved in accordance with the invention by providing a NAND flash memory cell array in which control gates and charge storage gates are stacked in pairs arranged in rows between a bit line diffusion and a common source diffusion, with select gates on both sides of each of the pairs of stacked gates. The gates in each stacked pair are self-aligned with each other, and the charge storage gates are either a nitride or a combination of nitride and oxide.

In the disclosed embodiments, programming is done by hot electron injection from silicon substrate to the charge storage gates to build up a negative charge in the charge storage gates. Erasing is done by channel tunneling from the charge storage gates to the silicon substrate or by hot hole injection from the silicon substrate to the charge storage gates.

DETAILED DESCRIPTION

Figure 1:
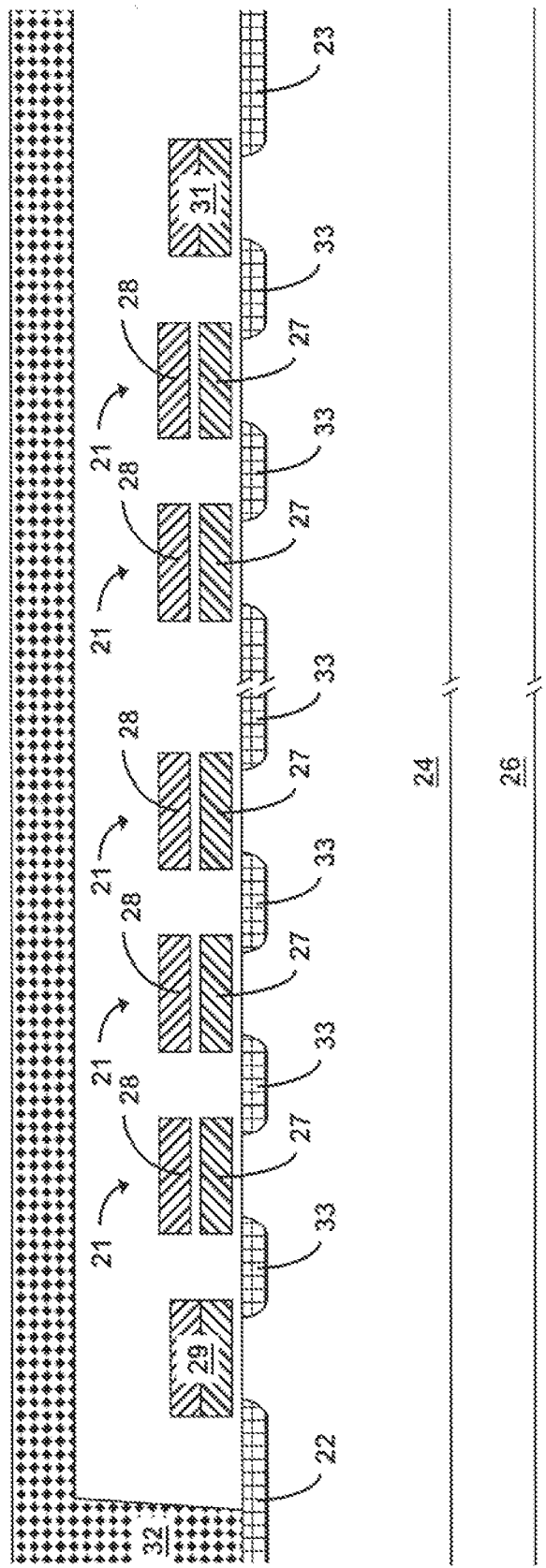
FIG. 1 is a cross-sectional view of a prior art NAND flash memory array with a series of stack-gate flash memory cells.
Figure 2:
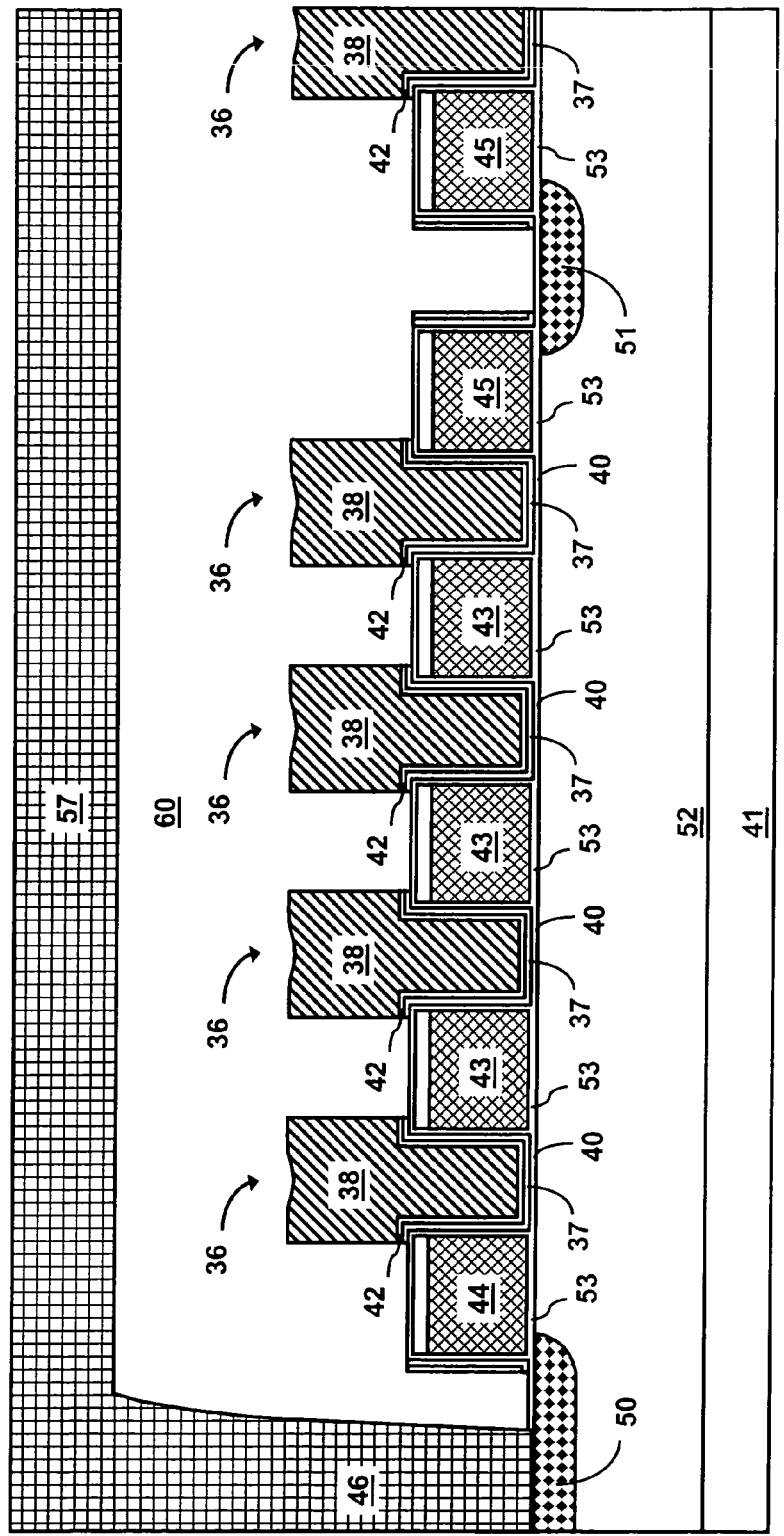
FIG. 2 is a cross-sectional view, taken along line 2-2 in FIG. 4, of one embodiment of a NAND flash memory cell array incorporating the invention.

As illustrated in FIG. 2, the memory includes an array of NAND flash memory cells 36, each of which has a charge storage gate 37 and a control gate 38. A series or group of cells in one row of the array is positioned between a bit line diffusion 50 and a common source diffusion 51 which are formed in a P-type well 52 in the upper portion of a substrate 41 and doped with an N-type material.

In this embodiment, the charge storage gates extend beneath and along the lower portions of the side walls of the control gates. They are fabricated of nitride or a combination of nitride and oxide, which are nonconductive dielectric materials, with a preferred thickness on the order of 60 Å to 200 Å. Dielectric films 42 are formed between the charge storage gates and control gates, and gate insulators 40 are formed beneath and along the sides of the charge storage gates. The dielectric films can be a pure oxide or a nitrided oxide. The control gates are fabricated of a conductive material such as a doped polysilicon or polycide.

Cell select gates 43 are positioned between stack-gate cells 36, and row select gates 44, 45 are positioned between the cells at the ends of the row and bit line contact 46 and source diffusion 51. The select gates are fabricated of a conductive material such as a doped polysilicon or polycide. They are parallel to the control gates and the charge storage gates. The select gates are separated from the substrate by gate oxide layers 53, which can be either a pure oxide or a combination of oxide and nitrided oxide. They are insulated from the charge storage gates by gate insulators 40.

Select gates 44 and 45 partially overlap bit line diffusion 50 and common source diffusion 51, with edge portions of the two gates being positioned above edge portions of the diffusions. The common source diffusions extend continuously in a direction perpendicular to the rows in which the cells are grouped, and are shared by groups of cells on both sides of the diffusions.

Figure 3:
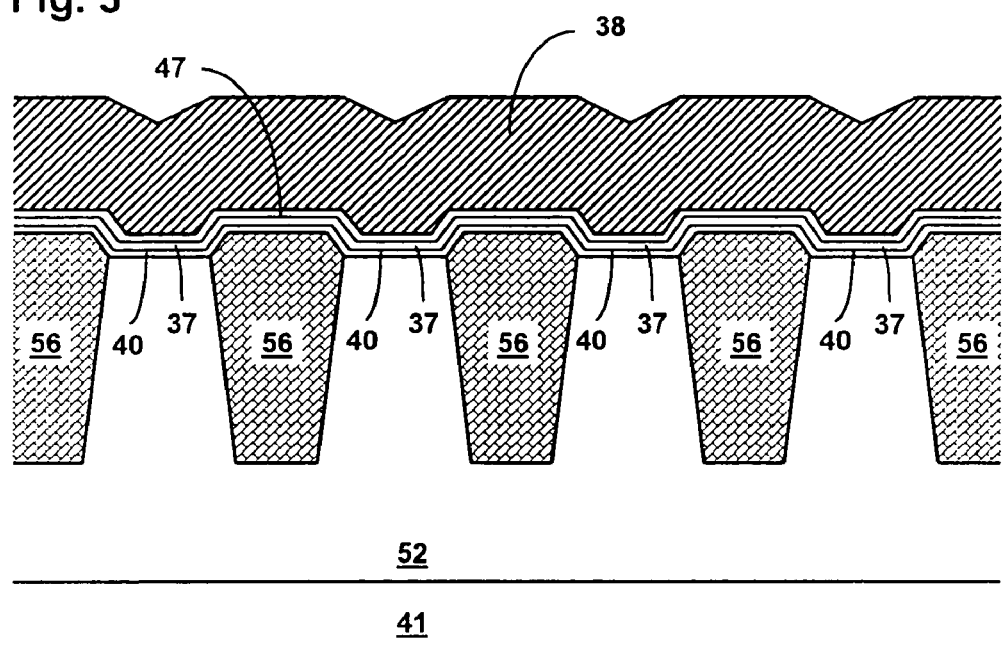
FIG. 3 is a cross-sectional view taken along line 3-3 in FIG. 4.

As best seen in FIG. 3, isolation regions 56 are formed in the substrate between the charge storage gates in adjacent rows of cells, and control gates 38 extend in a direction parallel to the source diffusions, crossing over the charge storage gates and isolation regions. Bit lines 57 are positioned above the rows of cells, crossing over stacked gates 37, 38 and select gates 43, 44, 45, with contacts 46 extending between the bit lines and the bit line diffusions. The bit lines are thus perpendicular to the select gates and to the source diffusions.

Figure 4:
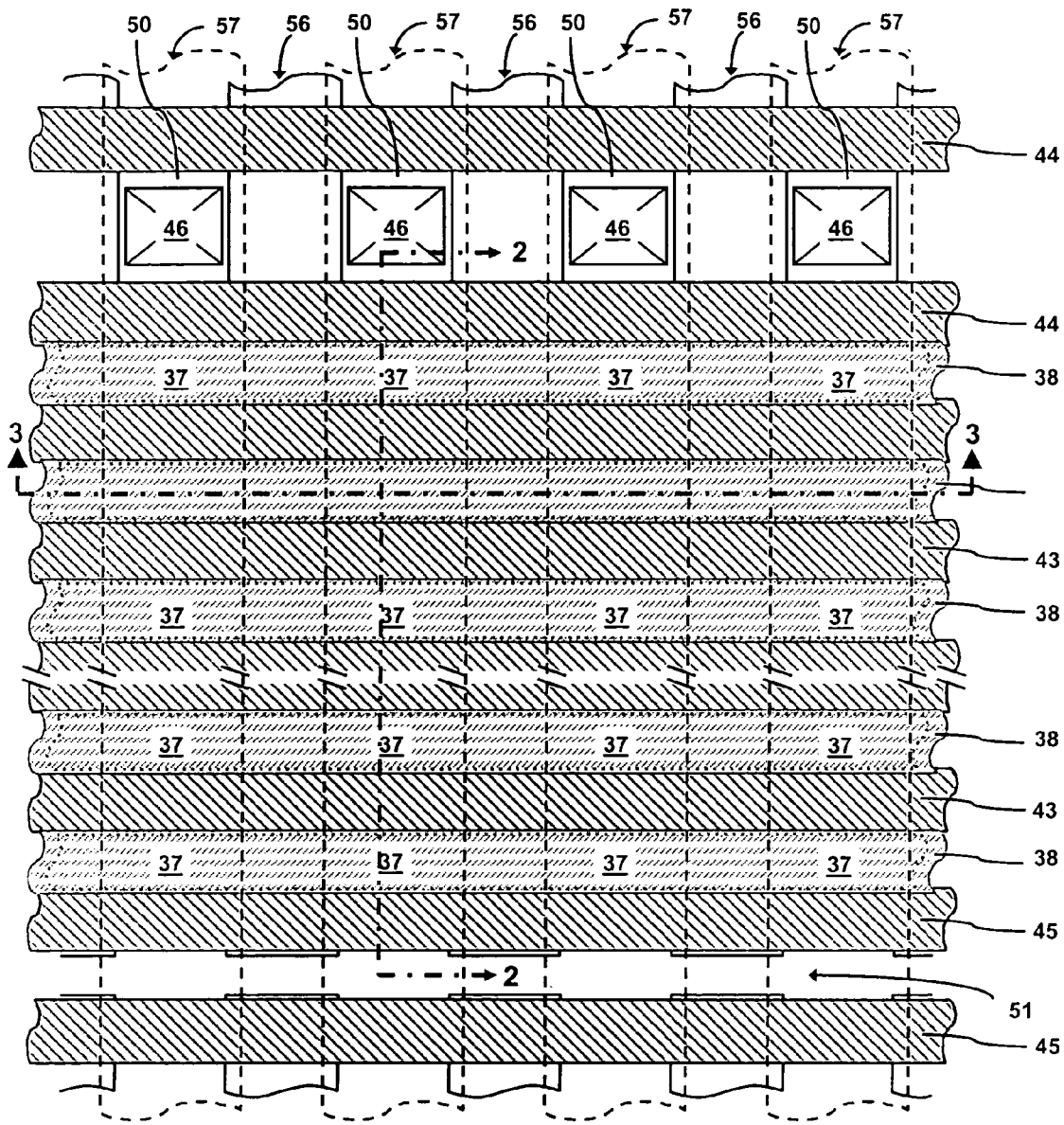
FIG. 4 is a top plan view of the embodiment of FIG. 2.

The memory cell array of FIGS. 2-4 can be fabricated by the process illustrated in FIGS. 5A-5F. In this process, an oxide layer 53 is thermally grown to a thickness of about 40 Å to 100 Å on a monocrystalline silicon substrate which, in the embodiment illustrated, is in the form of a P-type substrate 41 in which a P-type well 52 is formed. Alternatively, if desired, an N-type well can be formed in the P-type substrate, in which case the P-type well will be formed in the N-type well.

A conductive layer 59 of polysilicon (poly-1) is deposited on the thermal oxide to a thickness on the order of 300 Å to 1500 Å, and a dielectric layer 61 is formed on the silicon. This silicon is preferably doped with phosphorus, arsenic or boron to a level on the order of $10^{18}$ to $10^{20}$ per cm$^3$. The doping can be done in-situ during deposition of the silicon or by ion implantation directly into the silicon or through the dielectric 61 above it.

Figure 5A:
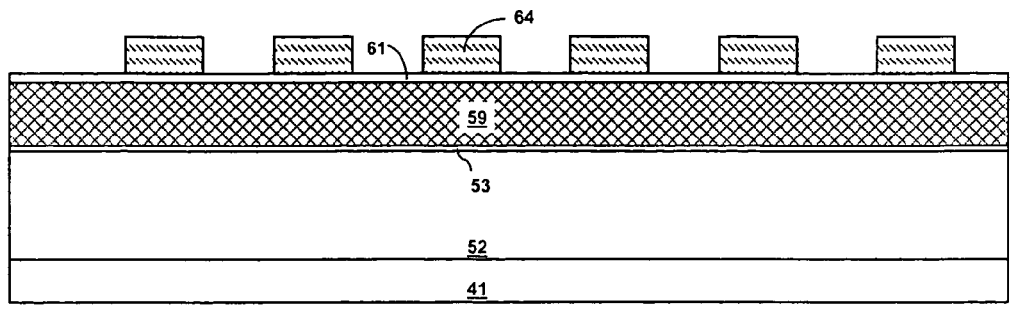
FIGS. 5A-5F are schematic cross-sectional views illustrating the steps in one embodiment of a process for fabricating a NAND flash memory cell array in accordance with the invention.
Figure 5B:
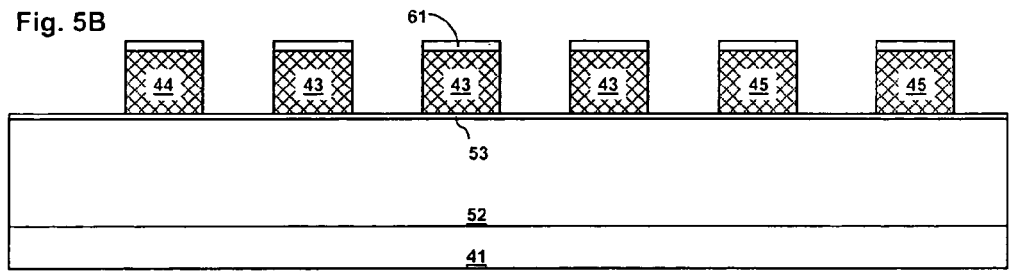
Figure 5C:
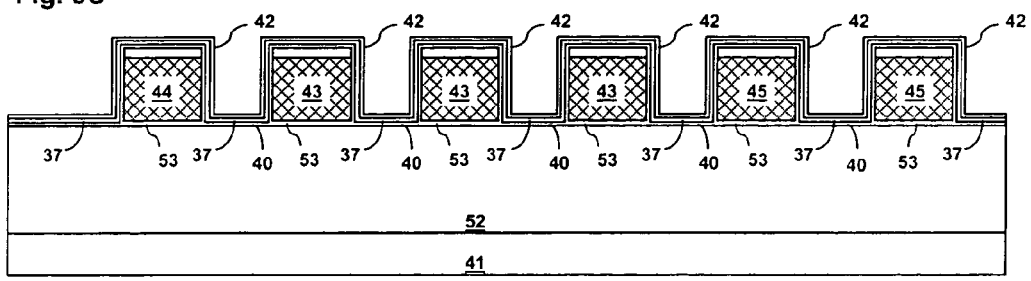

A photolithographic mask 64 is applied to dielectric layer 61 to define the select gates. The unmasked portions of the dielectric and silicon layers are etched away anisotropically to form select gates 43, 44, 45, as illustrated in FIG. 5B. Then, as shown in FIG. 5C, a dielectric 40 is formed on the silicon substrate and the side walls of the select gates. This dielectric can be a pure oxide film or a nitrided oxide film. A charge storage film 37 is then formed above the dielectric 40. This charge storage film can be a nitride or the combination of oxide and nitride. Then, another dielectric film 42 is formed. This dielectric can be a pure oxide film or a nitrided oxide film.

Figure 5D:
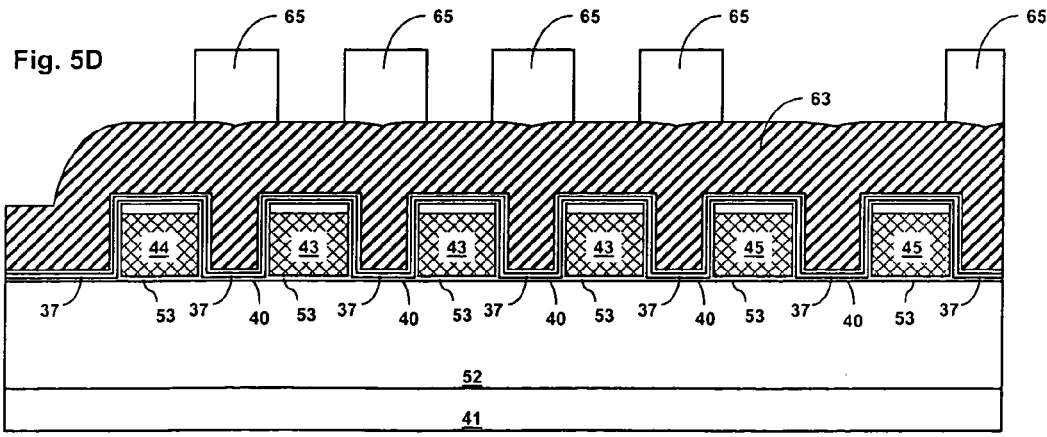

As illustrated in FIG. 5D, a conductive layer 63 of polysilicon or polycide (poly-2) is deposited on dielectric film 42 to a thickness on the order of 1000 Å to 2500 Å and is doped with phosphorus, arsenic or boron to a level on the order of $10^{20}$ to $10^{21}$ per cm$^3$. A photolithographic mask 65 is then formed over conductive layer 63 to define the control gates.

Figure 5E:
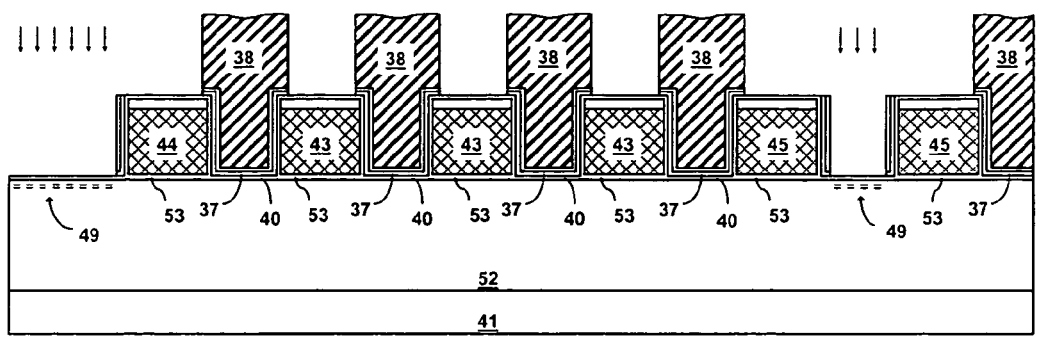

The unmasked portions of the poly-2 layer, dielectric layer 42, and storage layer 37 are etched away anisotropically to form the control gates 38, as illustrated in FIG. 5E. Diffusion regions 49 are then formed in the substrate next to select gates 44, 45 by ion implantation with dopants such as $P^{31}$ or $As^{75}$.

Figure 5F:
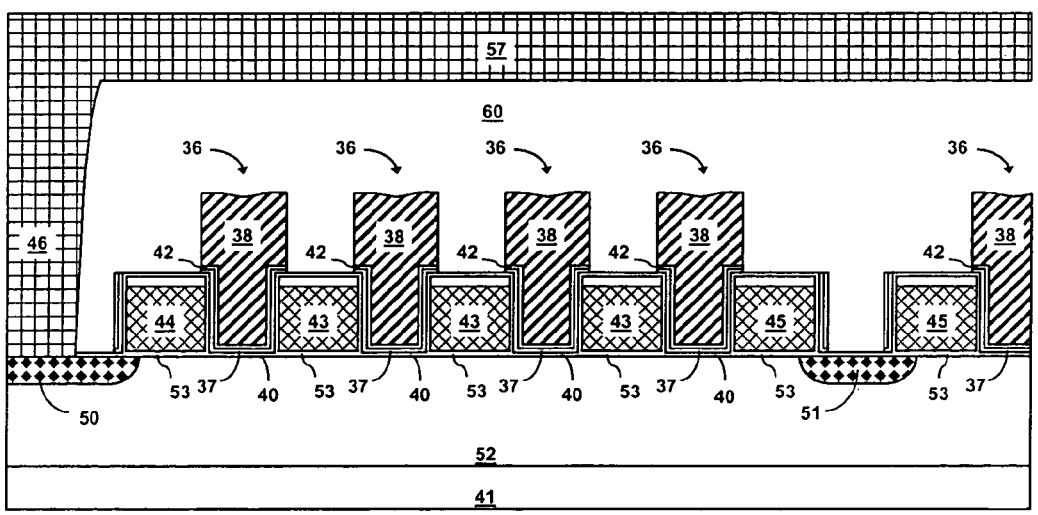

Thereafter, a glass material 60 such as phosphosilicate glass (PSG) or borophosphosilicate glass (BPSG) is deposited across the entire wafer, then etched to form openings for bit line contacts 46, as shown in FIG. 5F. Finally, a metal layer is deposited over the glass and patterned to form bit lines 57 and bit line contacts 46.

Figure 6:
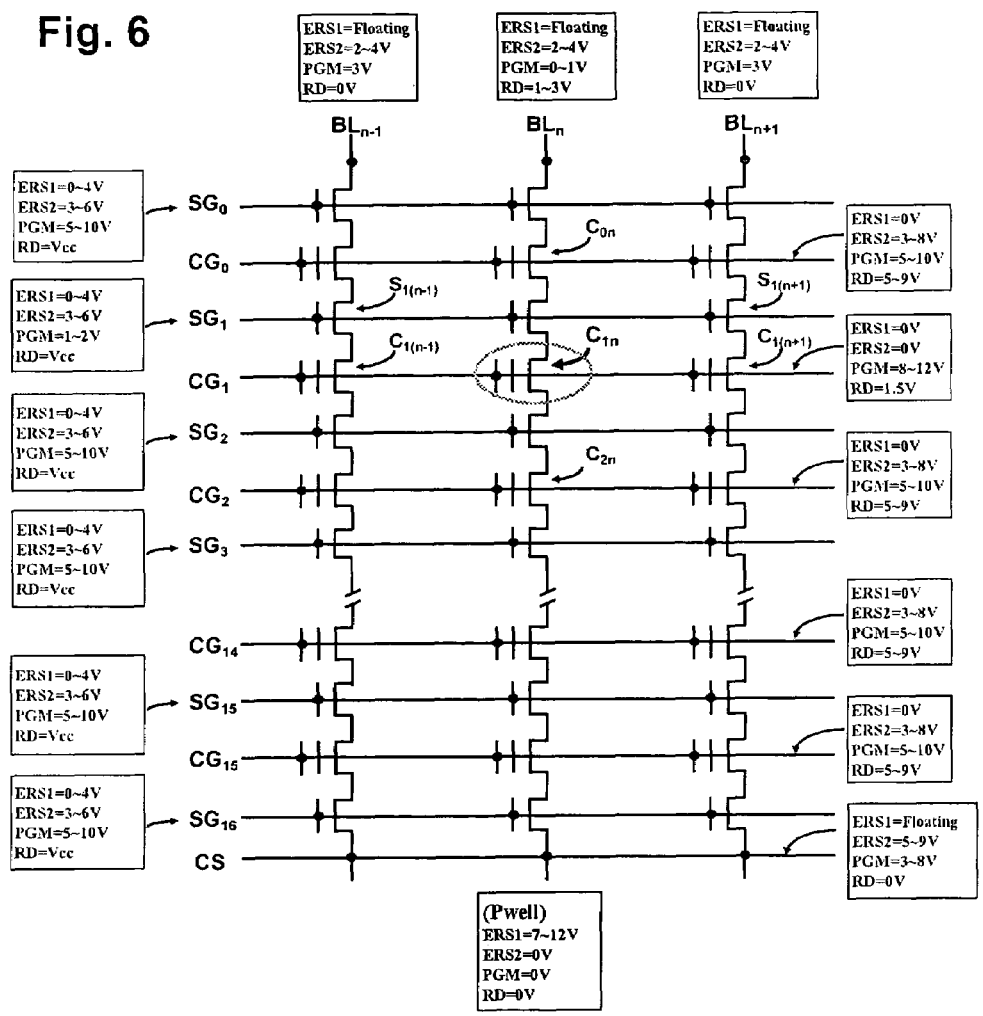
FIG. 6 is circuit diagram of a small memory array as in the embodiment of FIG. 2, with exemplary bias conditions for erase, program and read operations.

Operation and use of the memory cell array can be described with reference to FIG. 6 where exemplary bias voltages for erase (ERS), program (PGM) and read (RD) operations are shown next to the terminals of the array. In this example, memory cell $C_{1n}$ is selected. This cell is located at the intersection of control gate $CG_1$ and bit line $BL_n$, and is encircled on the drawing for ease of location. All of the other memory cells in the array are unselected.

Erasing can be done using two different bias conditions. In erase mode 1 (ERS1), the control gate is biased at 0 volts, the select gates are biased at 0 to 4 volts, the bit line and common source are floating, and P-well is biased at 7 to 12 volts. With this bias condition, a uniform channel tunneling occurs. As the charge storage gate becomes more positively charged, the threshold voltage of the memory cell, which is preferably on the order of −1 to 1 volt in this embodiment, becomes lower. This results in an inversion layer in the channel beneath the charge storage gate when the control gate is biased at about 1.5 volts. Therefore, the memory cell goes into the conductive state (logic "1") after the erase operation.

In erase mode 2 (ERS2), the control gate of the selected cell is biased at 0 volts, the control gates of unselected cells are biased at 3 to 8 volts, the select gates are biased at 3 to 6 volts, the bit lines are biased at 2 to 4 volts, and the common source is biased at 5 to 9 volts. With this bias condition, a hot hole injection happens between the silicon substrate and the charge storage gate of the selected cell. As the charge storage gate becomes more positively charged, the threshold voltage of the memory cell, which is preferably on the order of −1 to 1 volt in this embodiment, becomes lower. This results in an inversion layer in the channel beneath the charge storage gate when the control gate is biased at about 1.5 volts. Therefore, the memory cell goes into the conductive state (logic "1") after the erase operation.

During a program operation, the control gate of the selected memory cell $C_{1n}$ is biased to a level of 8-12 volts, 5-10 volts is applied to select gates $SG_0$ and $SG_2$-$SG_{16}$, 5-10 volts is applied to the control gates of the other memory cells in the same bit line direction as the selected cell (e.g. $C_{0n}$ and $C_{2n}$), 0-1 volts is applied to the bit line, 0 volts is applied to P-well, and 3-8 volts is applied to the common source. The cells and the select transistors are turned on by applying 5-10 volts to the control gates and the select gates. The voltage applied to the select gate just before the selected cell ($SG_1$ and $C_{1n}$ in this example) can be on the low side, preferably on the order of 1-2 volts.

With this bias condition, most of the voltage between the common source and the bit line appears across the mid-channel region between select gate $SG_1$ and the charge storage gate of the selected cell $C_{1n}$, resulting in a high electric field in that region. In addition, since the charge storage gate is coupled to a high voltage from the common source node (i.e., control gate $CG_1$ and select gate $SG_2$), a strong vertical electric field is established across the oxide between the mid-channel region and the charge storage gate. When electrons flow from the bit line to the common source during the program operation, they are accelerated by the electric field across the mid-channel region, and some of them become heated. Some of the hot electrons get accelerated by the vertical field, which causes them to overcome the energy barrier of the oxide (about 3.1 eV) and inject into the charge storage gate.

At the end of the program operation, the charge storage gate is negatively charged, and the threshold voltage of the memory cell, which preferably is on the order of 2-4 volts, becomes higher. Thus, the memory cell is turned off when the control gate is biased at about 1.5 volts during a read operation. Following a program operation, the memory cell goes into a non-conductive state (logic "0").

In the unselected memory cells $C_{1(n-1)}$ and $C_{1(n+1)}$ which share the same control gate with the selected cell $C_{1n}$, the bit line is biased at 3 volts, the select gate $SG_1$ is at 1-2 volts, and the control gate is at 8-12 volts. Thus, select transistors $S_{1(n-1)}$ and $S_{1(n+1)}$ are turned off, and there is no mid-channel hot carrier injection taking place in cells $C_{1(n-1)}$ and $C_{1(n+1)}$. The other unselected memory cells $C_{0n}$ and $C_{2n}$ are biased with 0-1 volts to the bit line, 5-10 volts to the control gates, and 5-10 volts to the select gates just before them, which minimizes the mid-channel hot carrier injection, and the charge storage gate charges are unchanged.

In the read mode, the control gate of the selected memory cell $C_{1n}$ is biased at about 1.5 volts, the common source is biased to 0 volt, 1-3 volts is applied to the bit line, and Vcc is applied to the select gates. The unselected memory cells in the bit line direction, e.g. $C_{0n}$ and $C_{2n}$, are turned on by applying 5-9 volts to their control gates. When the memory cell is erased, the read shows a conductive state because the channel of selected cell is turned on, and the other cells and the select transistors in the same bit line direction also turned on. Thus, a logic "1" is returned by the sense amplifier. When the memory cell is programmed, the read shows a non-conductive state because the channel of the selected cell is turned off, and hence the sense amplifier returns a logic "0". In the unselected memory cells $C_{1(n-1)}$ and $C_{1(n+1)}$, both the bit line and common source nodes are biased at 0 volts, and there is no current flow between the bit line and the common source nodes.

Figure 8:
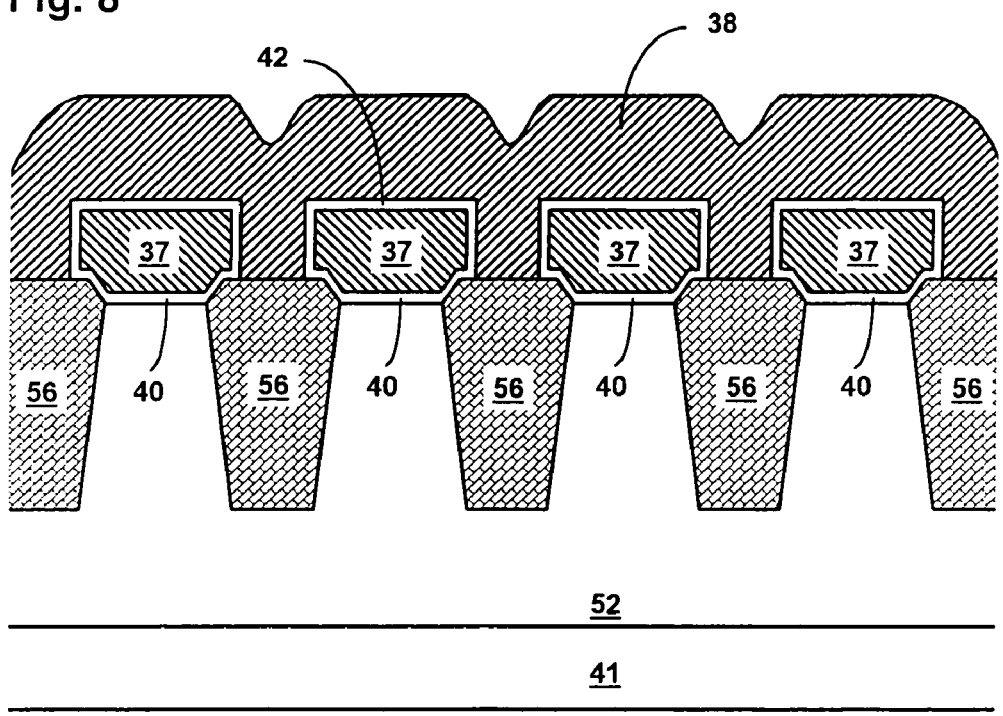
FIG. 8 is a cross-sectional view taken along line 3-3 in FIG. 9.
Figure 7:
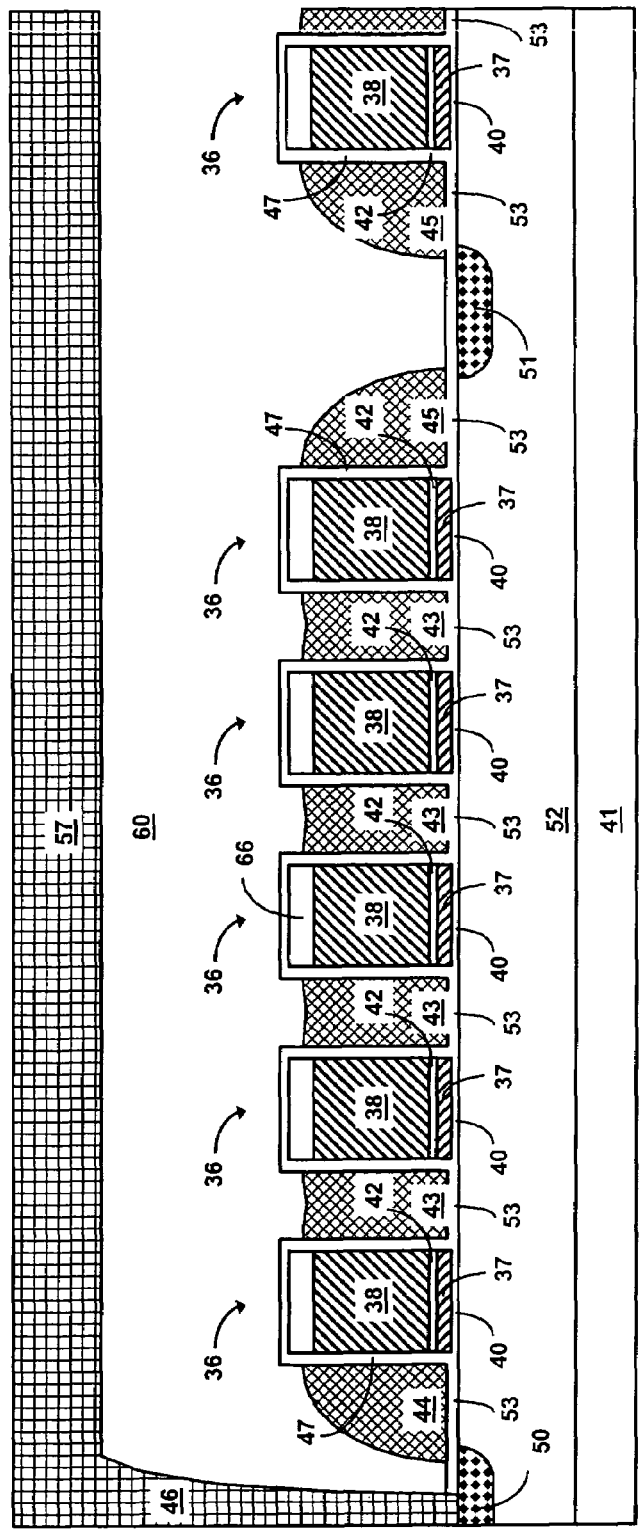
FIG. 7 is a cross-sectional view, taken along line 7-7 in FIG. 9, of another embodiment of a NAND flash memory cell array incorporating the invention.
Figure 9:
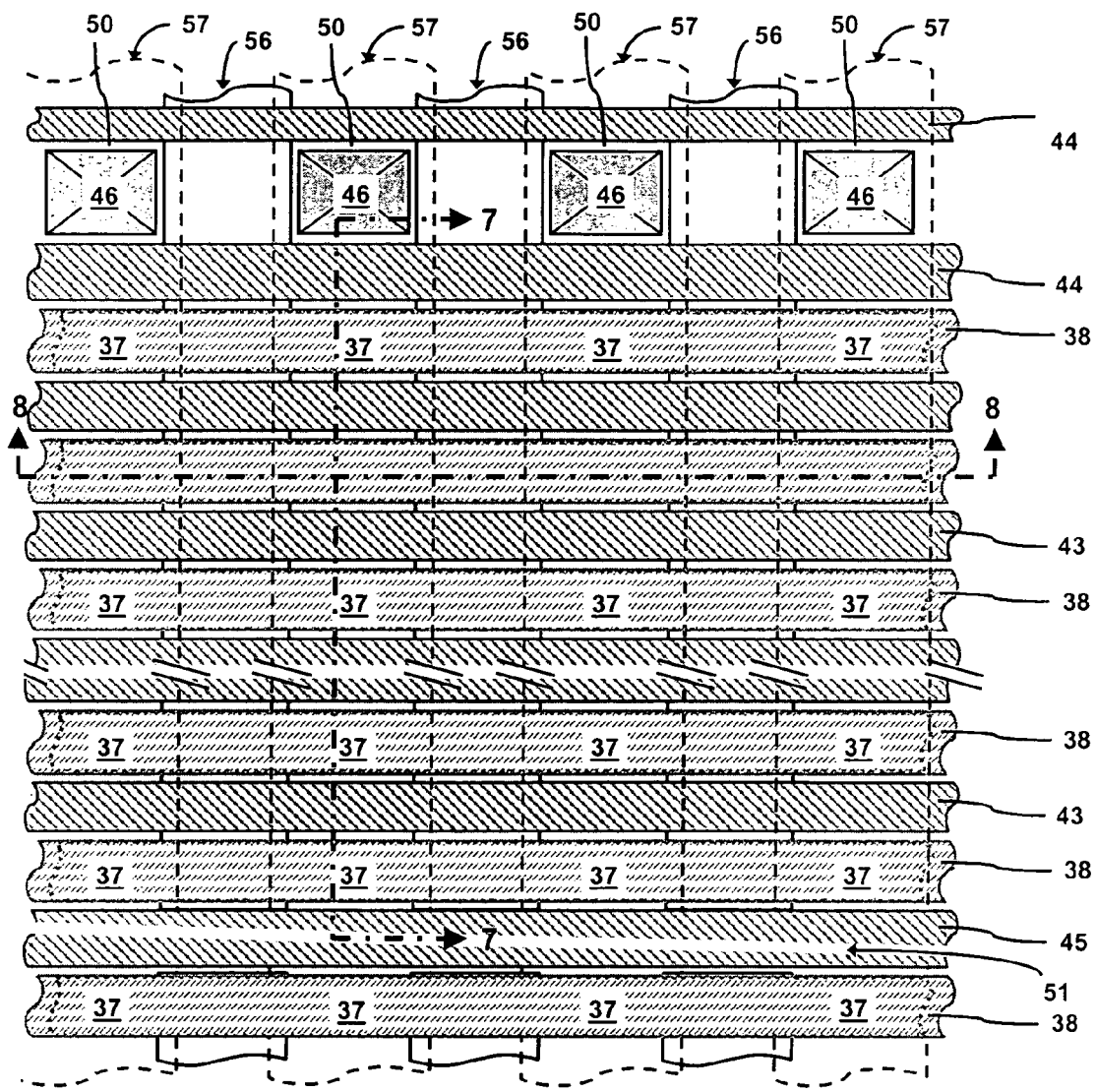
FIG. 9 is a top plan view of the embodiment of FIG. 7.

The embodiment of FIGS. 7-9 is generally similar to the embodiment of FIGS. 2-4, and like reference numerals designate corresponding elements in the two. It differs, however, in that charge storage gates 37 are positioned entirely beneath control gates 38 and do not extend along the side walls of the control gates. Gate insulators 40 and dielectric 42 are likewise limited to the areas directly beneath and above the charge storage gates, and the select gates are separated from the control gates and the side edges of the charge storage gates by dielectric 47.

As in the embodiment of FIGS. 2-4, control gates 38 cross over the charge storage gates 37 and isolation regions 56 in adjacent rows of cells, and select gates 43-45 extend in a direction perpendicular to the rows and parallel to the control gates. Bit lines 57 are perpendicular to the select and control gates, and cross over the bit line contact 46, select gates, and control gates 38 in each row of the array. The erase path once again extends from the charge storage gate through tunnel oxide 40 to the channel region below.

A preferred process of fabricating the embodiment of FIGS. 7-9 is illustrated in FIGS. 10A-10E. In this process, oxide layer 40 is thermally grown to a thickness of about 40 Å to 100 Å on a monocrystalline silicon substrate which, in the embodiment illustrated, is in the form of a P-type substrate 41 in which a P-type well 52 is formed. Alternatively, if desired, an N-type well can be formed in the P-type substrate, in which case the P-type well will be formed in the N-type well.

A charge storage layer 62 of a nitride or the combination of nitride and oxide is formed on the thermal oxide to a thickness on the order of 60 Å to 200 Å. Then, another dielectric layer 42 is formed on the charge storage layer. This dielectric can be a pure oxide layer or a nitrided oxide layer.

A conductive layer 63 of polysilicon (poly-1) is deposited on dielectric film 42. This layer has a thickness on the order of 1500 Å-3500 Å, and is doped with phosphorus, arsenic or boron to a level on the order of $10^{20}$ to $10^{21}$ per $cm^3$. A CVD oxide or nitride layer 66 having a thickness on the order of 300 Å-1000 Å is deposited on the poly-1 layer, and is used as a mask to prevent the poly-1 material from etching away during subsequent dry etching steps.

Figure 10A:
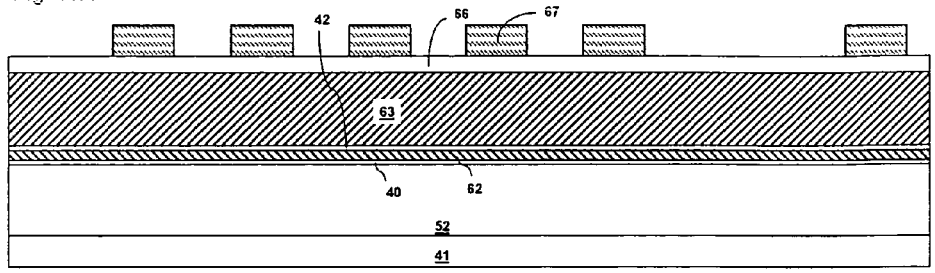
FIGS. 10A-10E are schematic cross-sectional views illustrating the steps in one embodiment of a process for fabricating the NAND flash memory cell array of FIG. 7.
Figure 10B:
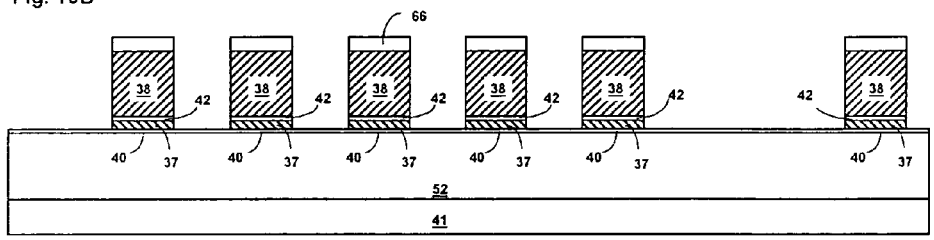

A photolithographic mask 67 is formed over layer 66 to define the control gates, and the unmasked portions of that layer and poly-1 layer 63 are etched away anisotropically, leaving only the portions of the poly-1 which form the control gates 38. The exposed portions of the dielectric 42 and the underlying portions of the charge storage layer 62 are then etched away anisotropically to form the charge storage gates 37, as illustrated in FIG. 10B.

Figure 10C:
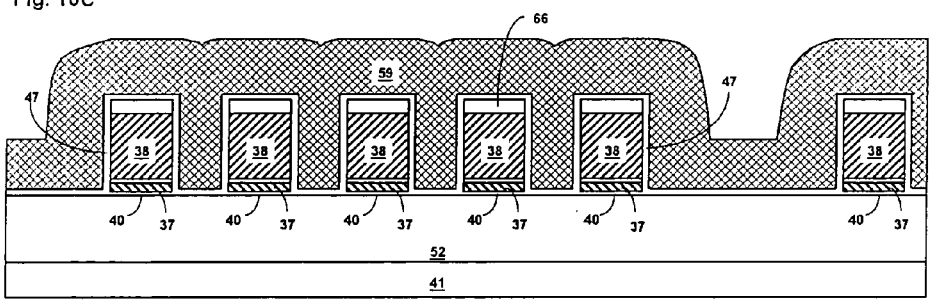

Then, a dielectric 47 is formed on the sidewalls of control and charge storage gates, and a conductive (poly-2) layer 59 is deposited over the entire wafer, as shown in FIG. 10C. The dielectric can be an oxide, a nitrided oxide, or the combination of oxide and nitrided oxide. The poly-2 layer is typically doped polysilicon or polycide, and is deposited to a thickness on the order of 1500 Å-3000 Å.

Figure 10D:
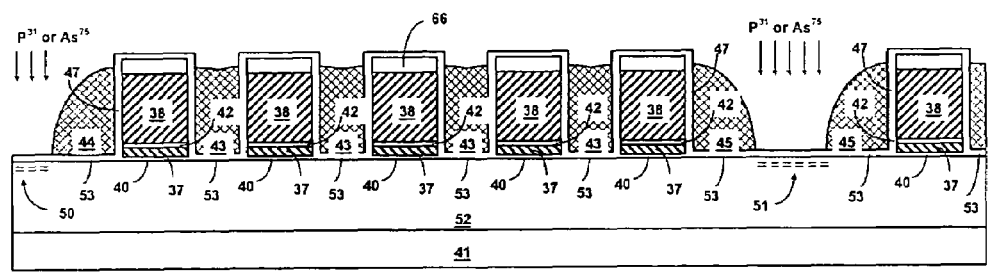

The poly-2 layer is then etched anisotropically to form select gates 43, 44, 45, as illustrated in FIG. 10D. Being formed in this manner, the select gates are self-aligned and parallel to the control gates. N-type dopants such as $P^{31}$ or $As^{75}$ are implanted into P-well 52 to form the bit line diffusion 50 and common source diffusion 51.

Figure 10E:
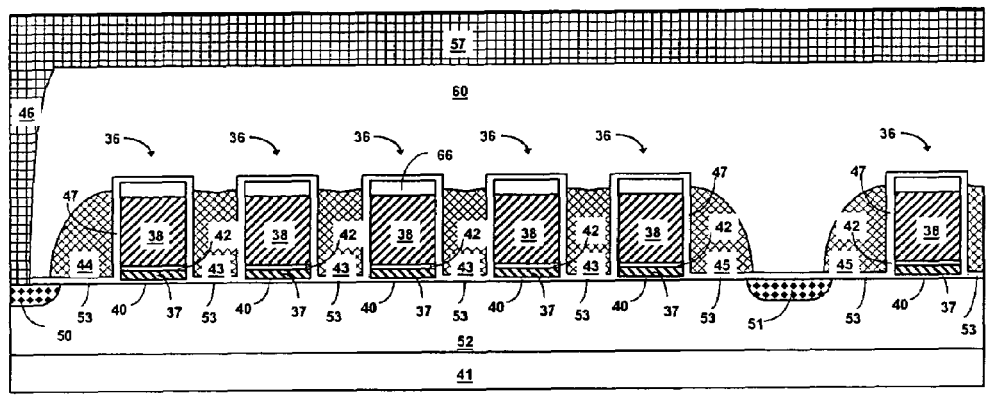

Thereafter, a glass material 60 such as phosphosilicate glass (PSG) or borophosphosilicate glass (BPSG) is deposited across the entire wafer, then etched to form openings for bit line contacts 46, as shown in FIG. 10E. Finally, a metal layer is deposited over the glass and patterned to form bit lines 57 and bit line contacts 46.

Figure 11:
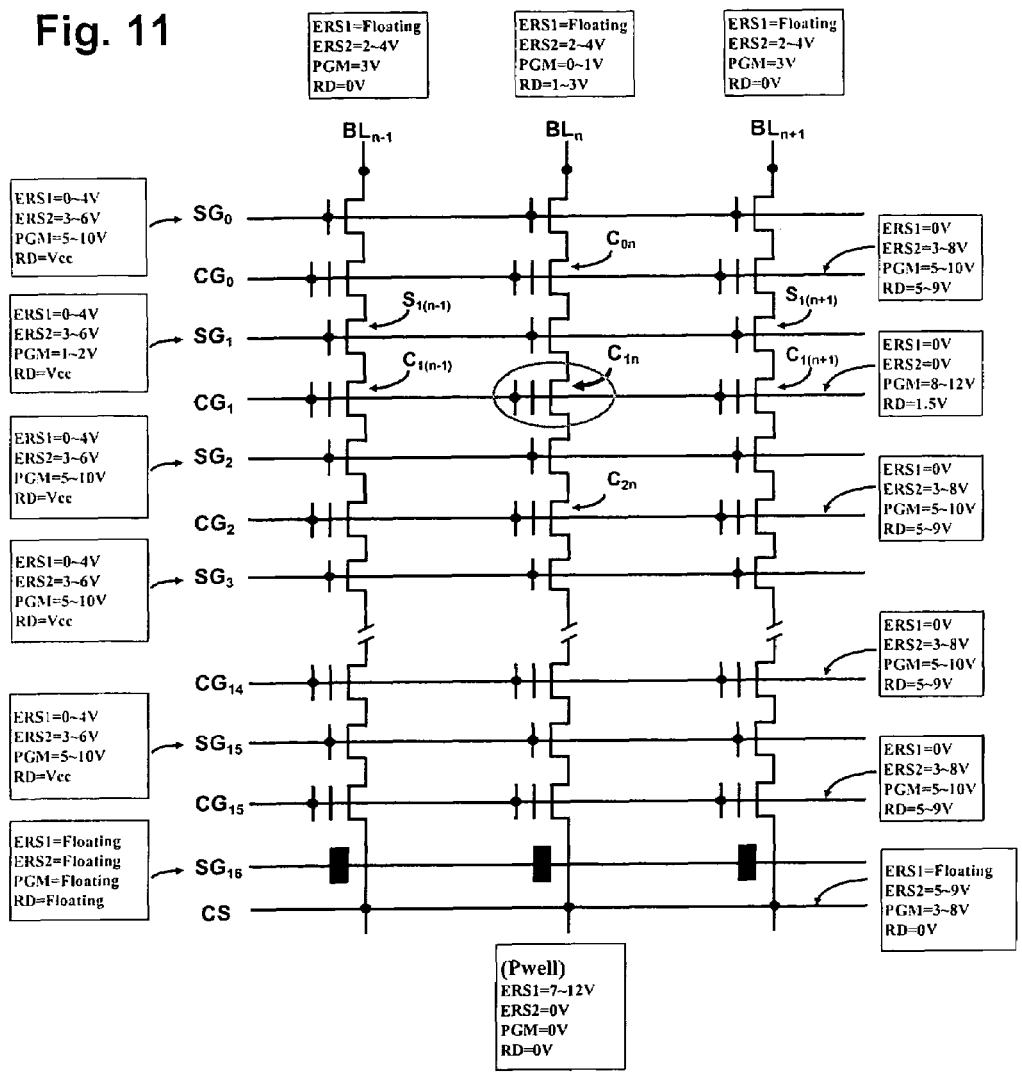
FIG. 11 is circuit diagram of a small memory array as in the embodiment of FIG. 7, with exemplary bias conditions for erase, program and read operations.

Operation of the embodiment of FIGS. 7-9 is generally similar to that of the embodiment of FIGS. 2-4. In FIG. 11, exemplary bias voltages for erase (ERS), program (PGM) and read (RD) operations are shown next to the terminals of the array. In this example, memory cell $C_{1n}$ is once again selected. This cell is located at the intersection of control gate $CG_1$ and bit line $BL_n$, and is encircled on the drawing for ease of location. All of the other memory cells in the array are unselected.

The invention has a number of important features and advantages. It provides a NAND flash memory cell array with significantly smaller cell size and greater cell density than memory structures heretofore provided. The array is biased so that all of the memory cells in it can be erased simultaneously, while programming is bit selectable.

It is apparent from the foregoing that a new and improved NAND flash memory and process of fabrication have been provided. While only certain presently preferred embodiments have been described in detail, as will be apparent to those familiar with the art, certain changes and modifications can be made without departing from the scope of the invention as defined by the following claims.

The invention claimed is:

1. A NAND flash memory cell array, comprising: a silicon substrate, a row of cells extending across the substrate, each of the cells having a charge storage gate fabricated of a nonconductive dielectric material and a control gate stacked above and aligned with the charge storage gate, row select gates adjacent to the cells at opposite ends of the row, cell select gates interposed between the cells, a first dielectric layer between the charge storage gates and the silicon substrate, a second dielectric layer between the charge storage gates and the control gates, a third dielectric layer between the select gates and the charge storage gates, a bit line diffusion region and a common source diffusion region in the substrate at opposite ends of the row and adjacent to the row select gates, a bit line, and a bit line contact interconnecting the bit line and the bit line diffusion.

2. The memory cell array of claim 1 wherein the charge storage gates are fabricated of nitride.

3. The memory cell array of claim 1 wherein the charge storage gates are fabricated of a combination of oxide and nitride.

4. The memory cell array of claim 1 wherein a negative voltage is applied between the control gate of a selected cell and the silicon substrate to form an erase path from the charge storage gate in the selected cell through the first dielectric layer to the substrate.

5. The memory cell array of claim 1 wherein a voltage which is negative relative to the bit line is applied to the control gate in a selected cell, and voltages which are positive relative to the bit line are applied to the select gates, the common source diffusion, and the control gates of the unselected cells to form an erase path from the silicon substrate through the first dielectric layer to the charge storage gate in the selected cell.

6. The memory cell array of claim 1 wherein a voltage which is negative relative to the common source diffusion is applied to the control gate of a selected cell, and voltages which are positive relative to the common source are applied to the select gates, the bit line, and the control gates of the unselected cells to form an erase path from the silicon substrate through the first dielectric layer to the charge storage gate in the selected cell.

7. The memory cell array of claim 1 wherein a hot electron injection path is formed between the charge storage gate in a selected cell and an underlying channel region in the substrate for building up a negative charge on the charge storage gate in the selected cell during a programming operation.

8. The memory cell array of claim 1 wherein program paths extend from off-gate channel regions in the substrate between the select gates and the charge storage gates to the charge storage gates, and the select gate on the side of the selected cell facing the bit line is biased at a lower voltage than the other select gates in the row to control channel current for hot carrier injection during a programming operation.

9. The memory cell array of claim 1 wherein the select gates in unselected cells are biased at a relatively high voltage to turn on channels in the substrate beneath them to form a conduction path between the bit line diffusion and the source diffusion.

10. The memory cell array of claim 1 wherein a read path is formed with the common source diffusion at 0 volts, the bit line diffusion at 1-3 volts, and the control gates in the unselected cells at a relatively high positive voltage, and the control gate of a selected cell at relative low positive voltage to form a conduction channel in the substrate beneath the charge storage gate of the selected cell for an erase state and a non-conduction channel for a program state.

11. The memory cell array of claim 1 including an erase path which can erase the whole cell array simultaneously and a program path which is single cell selectable.

12. The memoy cell array of claim 1 wherein the charge storage gates extend beneath and along laterally opposed sides of the control gates.

13. The memory cell array of claim 12 wherein the dielectric material is selected from the group consisting of nitride and a combination of oxide and nitride.

14. The memory cell array of claim 12 wherein the charge storage gates have a thickness on the order of 60 Å to 200 Å.

15. The memory cell array of claim 1 wherein the charge storage gates have a thickness on the order of 60 Å to 200 Å.

* * * * *